US011950448B2

(12) United States Patent
Do et al.

(10) Patent No.: US 11,950,448 B2
(45) Date of Patent: Apr. 2, 2024

(54) OPTOELECTRONIC DEVICE BASED ON DUAL MICRO-CAVITY STRUCTURE

(71) Applicant: KYUNGPOOK NATIONAL UNIVERSITY INDUSTRY-ACADEMIC COOPERATION FOUNDATION, Daegu (KR)

(72) Inventors: Yun Seon Do, Daegu (KR); Jun Yong Kim, Daegu (KR)

(73) Assignee: KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 0 days.

(21) Appl. No.: 17/681,088

(22) Filed: Feb. 25, 2022

(65) Prior Publication Data

US 2022/0336777 A1 Oct. 20, 2022

(30) Foreign Application Priority Data

Apr. 14, 2021 (KR) .................. 10-2021-0048394

(51) Int. Cl.
*H10K 50/852* (2023.01)
*H10K 50/11* (2023.01)
(Continued)

(52) U.S. Cl.
CPC .......... *H10K 50/852* (2023.02); *H10K 50/11* (2023.02); *H10K 50/818* (2023.02); *H10K 50/828* (2023.02)

(58) Field of Classification Search
None
See application file for complete search history.

(56) References Cited

U.S. PATENT DOCUMENTS

2004/0105047 A1* 6/2004 Kato ............... H10K 50/852
349/69
2020/0220108 A1* 7/2020 Irobe ................. G02B 5/32
(Continued)

FOREIGN PATENT DOCUMENTS

JP 2004-127588 A 4/2004
KR 10-2009-0109874 A 10/2009
(Continued)

OTHER PUBLICATIONS

Office Action dated Sep. 13, 2022 in Korean Application No. 10-2021-0048394.

*Primary Examiner* — Daniel Whalen
(74) *Attorney, Agent, or Firm* — Sughrue Mion, PLLC

(57) ABSTRACT

The present disclosure relates to an optoelectronic device based on a dual micro-cavity structure, and more particularly, to a technology that simultaneously realizes the high Q factors of the three primary colors in an optoelectronic device based on a dual micro-cavity structure. The optoelectronic device according to one embodiment of the present disclosure is applied to a self-emissive device, and includes a first reflector layer, an active cavity layer formed on the first reflector layer, a second reflector layer formed on the active cavity layer, an external cavity layer formed on the second reflector layer, a third reflector layer formed on the external cavity layer, and a passivation layer formed on the third reflector layer, wherein a first micro-cavity corresponding to the first and second reflector layers and a second micro-cavity corresponding to the second and third reflector layers may be generated.

10 Claims, 13 Drawing Sheets

(51) Int. Cl.
*H10K 50/818* (2023.01)
*H10K 50/828* (2023.01)

(56) References Cited

U.S. PATENT DOCUMENTS

2021/0066662 A1\* 3/2021 Wang .................... H10K 50/15
2022/0006057 A1\* 1/2022 Itonaga .............. G03B 21/2006

FOREIGN PATENT DOCUMENTS

| KR | 10-2011-0085255 A | 7/2011 |
| KR | 10-2017-0127954 A | 11/2017 |
| KR | 10-2014399 B1 | 8/2019 |
| KR | 10-2100620 B1 | 5/2020 |

\* cited by examiner

200

400

600

610

800

810

820

OPTOELECTRONIC DEVICE BASED ON DUAL MICRO-CAVITY STRUCTURE

This work was supported by the Basic Science Research Programs through the National Research Foundation of Korea (NRF), Ministry of Education, under Grant NRF-2018R1D1A1B07045853.

This work was supported by the Technology Innovation Program (20016350, Development of ultra high quality with long lifetime of color converting material, process and module for extremely large-area micro LED display) funded By the Ministry of Trade, Industry & Energy (MOTIE, Korea).

CROSS-REFERENCE TO RELATED APPLICATION

This application claims priority to Korean Patent Application No. 10-2021-0048394, filed on Apr. 14, 2021 in the Korean Intellectual Property Office, the disclosure of which is incorporated herein by reference.

BACKGROUND OF THE DISCLOSURE

Field of the Disclosure

The present disclosure relates to an optoelectronic device based on a dual micro-cavity structure, and more particularly, to a technology that simultaneously realizes the high Q factors of the three primary colors in an optoelectronic device based on a dual micro-cavity structure.

Description of the Related Art

The spectral properties of an optoelectronic device may be determined by the optical properties of a film. Through the structural design of a film, a transparent or multi-colored multilayer film may be prepared, and the intensity of light in a specific wavelength band may be decreased or increased.

A one-dimensional photonic crystal is a periodic nanostructured thin film made of different dielectric materials, and this structure may block light in a specific wavelength band and may be used to detect specific materials.

In addition, a Fabry-Perot interferometer may be a resonator composed of two or more reflective films such as mirrors and multilayer films.

Resonance between reflective films may increase the intensity of light in a specific wavelength band, and such nanostructures may be used in applications such as electrodes, sensors, displays, and solar cells.

In particular, Fabry-Perot interferometers are used in organic light-emitting diodes (OLEDs) in displays.

In general, OLEDs can only extract about 20% of light generated inside due to optical modes such as a waveguide mode, a substrate mode, and surface plasmon.

Among light extraction techniques, an microcavity effect, which is a Fabry-Perot interferometer, is being studied to increase the light efficiency of OLEDs.

Basically, OLEDs are composed of multiple layers of organic materials between two electrodes, and conventional OLEDs include an electrode with high reflectivity and a transparent electrode. When the reflectance of the transparent electrode is increased, strong resonance may be caused by an microcavity effect.

The intensity of light extracted from OLEDs, color purity, red, green, and blue may be improved.

However, to fabricate RGB micro-cavity OLED (MOLED) sub-pixels, a micro-patterning operation such as e-beam lithography is required, which may be inefficient in terms of process cost and time.

Self-emissive devices having a micro-cavity structure include OLEDs, QLEDs, micro LEDs, and the like, and the micro-cavity structure may be related to a technology for controlling the characteristics of an electroluminescence (EL) spectrum extracted to the outside.

A high Q factor means high light intensity and a narrow spectrum at a specific resonance wavelength, and strong resonance may be created between a highly reflective electrode (reflector) and a semi-transparent electrode (reflector).

Through resonance, light having high light intensity and color purity may be extracted to the outside. In this case, the extracted light may be associated with a high Q factor.

A micro-cavity structure according to the related art is designed in a first-order resonance mode in consideration of the electrical characteristics between two electrodes.

Important parameters for designing a micro-cavity structure may include cavity thickness, which is the path length between two reflectors, and the reflectivity and phase change of the reflectors.

Various cavity structures are being studied by controlling the thickness of a cavity and the reflectivity and phase change of reflectors, and a one-dimensional photonic crystal is widely used to realize a high Q factor by increasing the reflectivity of reflectors.

FIG. 1 illustrates an optoelectronic device having a micro-cavity structure according to the related art.

Referring to FIG. 1, the optoelectronic device 100 having a micro-cavity structure according to the related art includes a substrate 110, a first reflector layer 120, an active cavity layer 130, a second reflector layer 140, and a passivation layer 150.

The first reflector layer 120 is formed of an electrode having high reflectivity, and the second reflector layer 140 is formed of a semi-transparent electrode.

For example, the first reflector layer 120 may be formed of an anode electrode, and the second reflector layer 140 may be formed of a cathode electrode.

The active cavity layer 130 is composed of a red cavity layer 131, a green cavity layer 132, and a blue cavity layer 133. The red, green, and blue cavity layers have different thicknesses, and the thickness of the active cavity layer 130 may be adjusted to control a resonance wavelength.

As described above, the optoelectronic device 100 having a micro-cavity structure according to the related art requires a micro-patterning operation such as e-beam lithography. In addition, since the thickness of an active cavity layer is different for each RGB, electrical characteristics may be affected.

FIG. 2 is a graph showing the photoluminescence (PL) spectrum and electroluminescence (EL) spectrum of an optoelectronic device having a micro-cavity structure according to the related art.

Referring to FIG. 2, a graph 200 shows the photoluminescence (PL) spectrum of an active cavity layer according to the related art and the electroluminescence (EL) spectrum of an optoelectronic device having a micro-cavity structure according to the related art.

In the graph 200, a first dotted line 210 may represent the PL of a blue layer, a second dotted line 211 may represent the PL of a green layer, and a third dotted line 212 may represent the PL of a red layer.

In addition, in the graph 200, a first solid line 220 may represent the EL of a blue layer, a second solid line 221 may represent the EL of a green layer, and a third solid line 222 may represent the EL of a red layer.

That is, the first dotted line 210 to the third dotted line 212 may represent the PL spectrum of each RGB, and the first solid line 220 to the third solid line 222 may represent the EL spectrum of light extracted to the outside of an optically designed micro-cavity in simulation for each RGB.

Spectra with peaks and wide full width at half maximum (FWHM) at each RGB resonance wavelength (470, 514, 610 nm) are observed. In the thickness of other RGB active cavity layers, the intensity of light is improved compared to RGB PL spectra. This indicates that RGB lights with a wide FWHM may be extracted to the outside.

However, the optoelectronic device having a micro-cavity structure according to the related art has problems in that the thicknesses of RGB active cavity layers are different, and the thicknesses of one-dimensional photonic crystal materials for improving the reflectivity of reflectors are different.

In addition, since the thicknesses of cavity materials or one-dimensional photonic crystal materials are different, additional cost and time are required in a micro-patterning process required in a fabrication process, and different cavity thicknesses between two electrodes for each RGB wavelength band may affect electrical properties.

SUMMARY OF THE DISCLOSURE

Therefore, the present disclosure has been made in view of the above problems, and it is an object of the present disclosure to provide an optoelectronic device based on a dual micro-cavity structure that may simultaneously realizes the high Q factors of three primary colors.

It is another object of the present disclosure to simultaneously form three narrow peaks in RGB wavelength bands by a first resonance phenomenon according to the thickness of the same active cavity layer and a secondary resonance phenomenon corresponding to an external cavity effect.

It is still another object of the present disclosure to save fabrication cost and time by forming active cavity layers in the same thickness without a micro-patterning operation by a dual micro-cavity structure.

It is still another object of the present disclosure to control the characteristics of light spectra extracted to the outside by designing the resonance mode of an external cavity layer as multiple resonance modes without considering electrical properties as the same electrical properties are obtained due to the same thickness of active cavity layers.

It is still another object of the present disclosure to obtain a high Q factor as the FWHM of a spectrum is narrowed due to the number of resonance modes of a dual micro-cavity, and thus the color purity of the three primary colors is improved.

It is still another object of the present disclosure to simultaneously improve the Q factors of the three primary colors before a color filter by emitting a white color in addition to RGB colors.

It is yet another object of the present disclosure to provide an optoelectronic device that may be used in various fields such as a display, lighting, a color conversion device, and a medical device.

In accordance with one aspect of the present disclosure, provided is an optoelectronic device including a first reflector layer, an active cavity layer formed on the first reflector layer, a second reflector layer formed on the active cavity layer, an external cavity layer formed on the second reflector layer, a third reflector layer formed on the external cavity layer, and a passivation layer formed on the third reflector layer, wherein the optoelectronic device generates a first micro-cavity corresponding to the first and second reflector layers and a second micro-cavity corresponding to the second and third reflector layers.

The active cavity layer may include an organic or inorganic emission material, and the external cavity layer may include an organic or inorganic passivation material.

The first reflector layer may include at least one of metallic electrode materials including at least one of gold, silver, and aluminum, alloy materials of gold, silver, and aluminum, and metamaterials, and the second and third reflector layers may include semi-transparent electrode materials including silver.

The first reflector layer may have a thickness of 100 nm or more, the second reflector layer may have a thickness of 1 nm to 30 nm, and the third reflector layer may have a thickness of 1 nm to 30 nm.

The first micro-cavity may be designed as a first-order resonance mode in consideration of optical and electrical properties, and the second micro-cavity may be designed as multiple resonance modes to form multiple peaks in a visible region.

The multiple resonance modes may be controlled by an effective optical path length based on change in a thickness of the external cavity layer.

The active cavity layer may generate light according to a first resonance in the self-emissive device, and the generated light may be transmitted through the second reflector layer to the external cavity layer.

The external cavity layer may reflect a secondary resonance phenomenon to the transmitted light, and the secondary resonance phenomenon may be associated with the number of multiple resonance modes and characteristics of an externally extracted light spectrum.

When the secondary resonance phenomenon is reflected and a specific resonance wavelength determined in the external cavity layer is identical to a resonance wavelength of the active cavity layer, an intensity of light at the specific resonance wavelength may be controlled to increase, and a light intensity of a resonance wavelength may be controlled by adjusting a resonance wavelength of the active cavity layer and the specific resonance wavelength.

As a thickness of the external cavity layer increases, the number of multiple resonance modes may increase.

The external cavity layer may form a plurality of peaks around a specific resonance wavelength based on the increased number of multiple resonance modes.

The external cavity layer may include a light absorption layer for controlling some of the increased multiple resonance modes generated in the external cavity layer.

The light absorption layer may include at least one light absorbing material of Cr, W, Ni, Ti, and Ge.

The active cavity layer may include a first active cavity layer, a second active cavity layer, and a third active cavity layer, and the first, second, and third active cavity layers may have the same thickness.

The first active cavity layer may exhibit a broad peak and a narrow spectrum at a resonance wavelength of 600 nm to 700 nm, the second active cavity layer may exhibit a broad peak and a narrow spectrum at a resonance wavelength of 500 nm to 600 nm, and the third active cavity layer may exhibit a broad peak and a narrow spectrum at a resonance wavelength of 400 nm to 500 nm.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
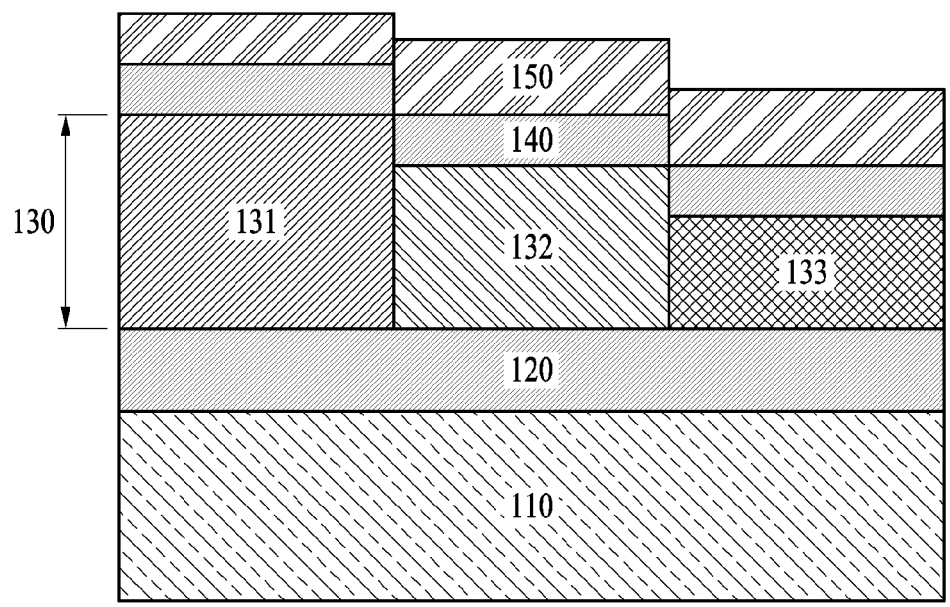
FIG. 1 illustrates an optoelectronic device having a micro-cavity structure according to the prior art.
Figure 2:
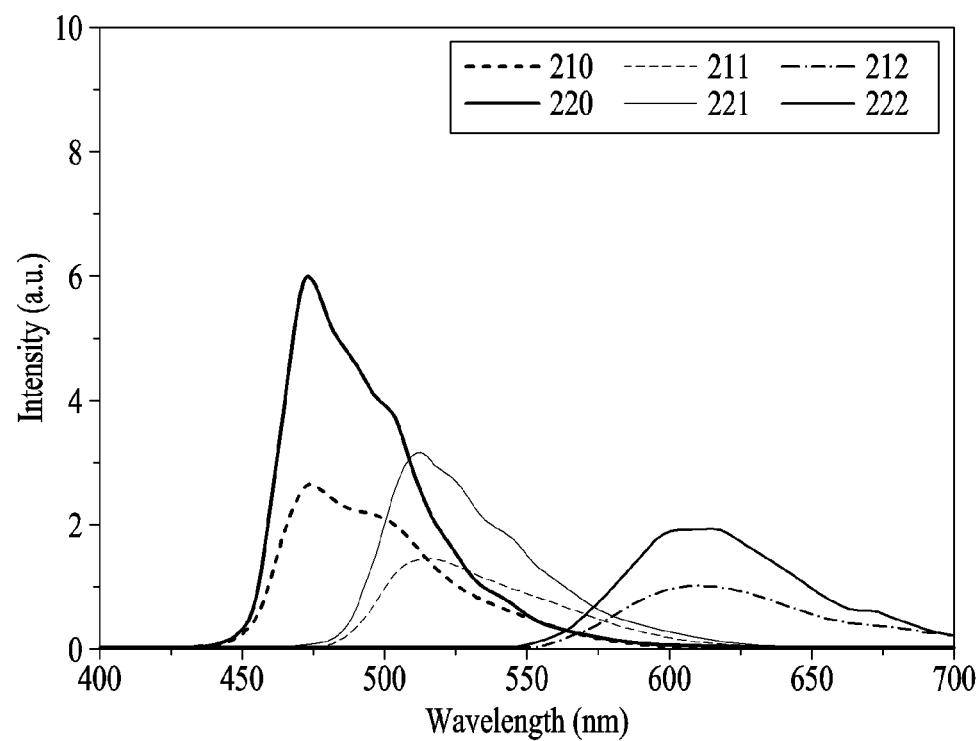
FIG. 2 is a graph showing the photoluminescence (PL) spectrum and electroluminescence (EL) spectrum of an optoelectronic device having a micro-cavity structure according to the prior art.

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present disclosure.

It should be understood that when an element is referred to as being "connected to" or "coupled to" another element, the element may be directly connected or coupled to the other element or intervening elements may be present. In contrast, when an element is referred to as being "directly connected to" or "directly coupled to" another element, there are no intervening elements present. Other words used to describe the relationship between elements or layers should be interpreted in a like fashion (e.g., "between," versus "directly between," "adjacent," versus "directly adjacent," etc.).

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings. However, the scope of the present disclosure is not limited by these embodiments. Like reference numerals in the drawings denote like elements.

Figure 3A:
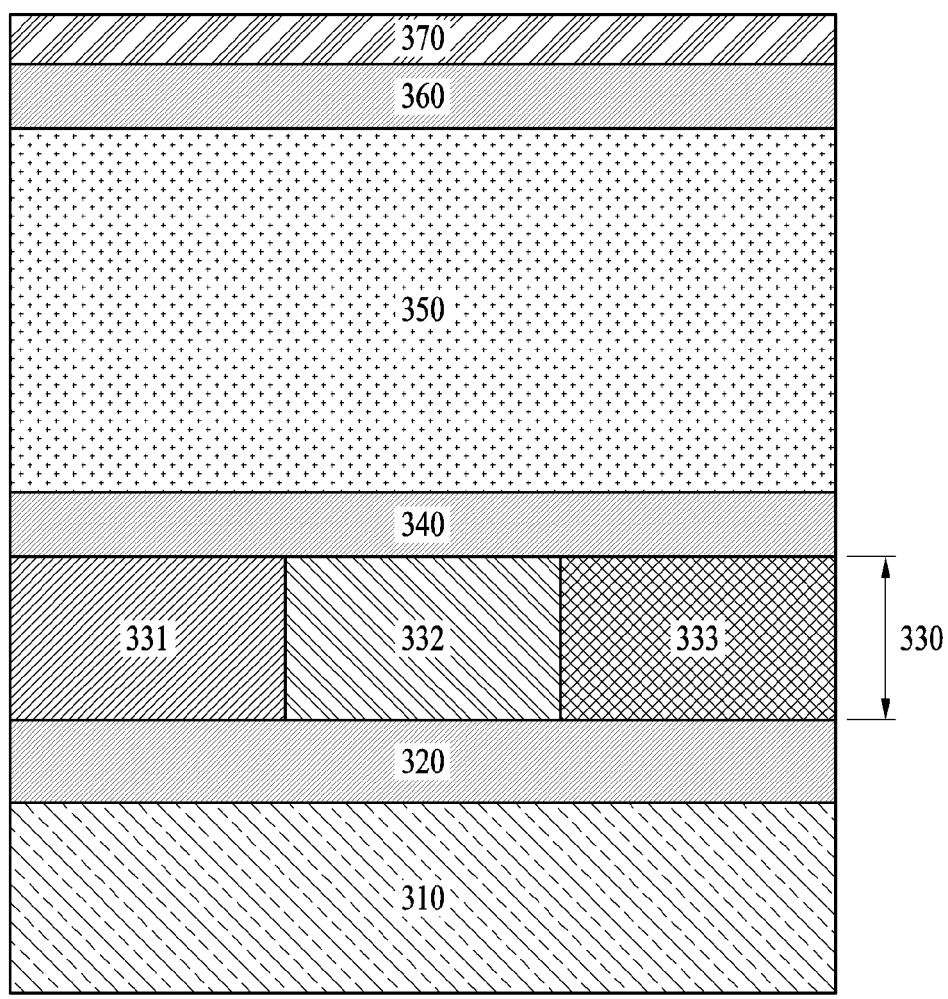
FIGS. 3A and 3B illustrate an optoelectronic device having a dual micro-cavity structure according to one embodiment of the present disclosure.
Figure 3B:
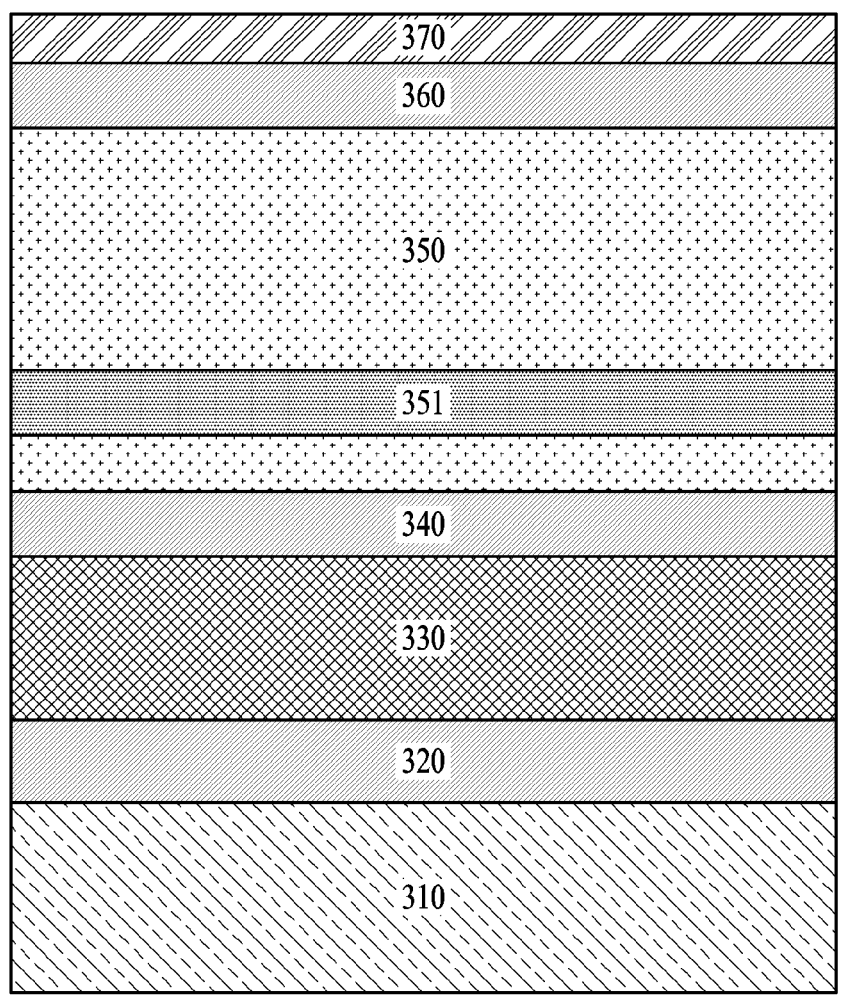

FIGS. 3A and 3B illustrate an optoelectronic device having a dual micro-cavity structure according to one embodiment of the present disclosure.

FIG. 3A illustrates the components of an optoelectronic device having a dual micro-cavity structure according to one embodiment of the present disclosure.

Referring to FIG. 3A, an optoelectronic device 300 having a dual micro-cavity structure includes a substrate 310, a first reflector layer 320, an active cavity layer 330, a second reflector layer 340, an external cavity layer 350, a third reflector layer 360, and a passivation layer 370.

For example, the external cavity layer 350, the third reflector layer 360, and the passivation layer 370 may also serve as a passivation layer.

For example, the optoelectronic device 300 having a dual micro-cavity structure is applied to a self-emissive device, and has a dual micro-cavity structure in which the first reflector layer 320, the active cavity layer 330, the second reflector layer 340, the external cavity layer 350, the third reflector layer 360, and the passivation layer 370 are sequentially formed. Here, the self-emissive device refers to a light-emitting device.

That is, the optoelectronic device 300 having a dual micro-cavity structure has a multilayer structure.

Specifically, the optoelectronic device 300 having a dual micro-cavity structure may include the first reflector layer 320 formed on the substrate 310, the active cavity layer 330 formed on the first reflector layer 320, the second reflector layer 340 formed on the active cavity layer 330, the external cavity layer 350 formed on the second reflector layer 340, the third reflector layer 360 formed on the external cavity layer 350, and the passivation layer 370 formed on the third reflector layer 360.

According to one embodiment of the present disclosure, the active cavity layer 330 may include a first active cavity layer 331, a second active cavity layer 332, and a third active cavity layer 333. The first active cavity layer 331 may correspond to a red region, the second active cavity layer 332 may correspond to a green region, and the third active cavity layer 333 may correspond to a blue region.

For example, the first active cavity layer 331, the second active cavity layer 332, and the third active cavity layer 333 have the same thickness, and thus the active cavity layer 330 is formed to have a single thickness.

According to one embodiment of the present disclosure, the active cavity layer 330 may include an organic or inorganic emission material.

For example, the active cavity layer 330 may have a transparent anode electrode embedded therein.

For example, the external cavity layer 350 may include an organic or inorganic passivation material.

According to one embodiment of the present disclosure, the first reflector layer 320 may include at least one of metallic electrode materials including at least one of gold, silver, and aluminum, alloy materials of gold, silver, and aluminum, and metamaterials.

For example, the second and third reflector layers 340 and 360 may include semi-transparent electrode materials including silver.

For example, the first reflector layer 320 may be an anode electrode, and the second reflector layer 340 may be a cathode electrode.

According to one embodiment of the present disclosure, the first reflector layer 320 may have a thickness of 100 nm or more, the second reflector layer 340 may have a thickness of 1 nm to 30 nm, and the third reflector layer 360 may have a thickness of 1 nm to 30 nm.

For example, the optoelectronic device 300 having a dual micro-cavity structure may generate a first micro-cavity corresponding to the first and second reflector layers 320 and 340 and a second micro-cavity corresponding to the second and third reflector layers 340 and 360.

According to one embodiment of the present disclosure, the first micro-cavity may be designed as a first-order resonance mode in consideration of optical and electrical properties, and the second micro-cavity may be designed as multiple resonance modes to form multiple peaks in the visible region.

For example, the multiple resonance modes may be controlled by an effective optical path length based on change in the thickness of the external cavity layer 350.

A Fabry-Perot factor may be derived by Equation 1 below.

$$f_{FP\_OLED\_TFE}(\lambda) = \frac{|t_{top\_OLED\_TFE}|^2}{1 + R^2 - 2R\cos\Delta\varphi_{FP\_OLED\_TFE}} \quad \text{[Equation 1]}$$

In Equation 1, $t_{top\_OLED\_TFE}$ represents the transmission coefficient of light emitted from the EML layer of an OLED and finally extracted to the air through a thin film encapsulation (TFE) structure, which is an external cavity layer, R represents a product of the reflection coefficient magnitude of light generated from the EML of the OLED and reflected by an aluminum (Al) reflector and the reflection coefficient magnitude of light generated form the EML of the OLED and reflected by silver (Ag), which is an OLED upper reflector including a thin film encapsulation (TFE) structure, an external cavity layer, and $\Delta\varphi_{FP\_OLED\_TFE}$ represents phase change occurring inside the OLED.

An equation that satisfies the constructive interference conditions of $\Delta\varphi_{FP\_OLED\_TFE}$ may be expressed as Equation 2 below.

$$\Delta\varphi_{FP\_OLED\_TFE} = -\varphi_{Al} - \varphi_{top\_OLED\_TFE} + n_{OLED}k_0 2d_{OLED} = 2m\pi \quad \text{[Equation 2]}$$

Equation 2 indicates that constructive interference occurs in an OLED structure in the case of m=0 (first-order mode), i.e., when the value of $\Delta\varphi_{FP\_OLED\_TFE}$ is 0, and the value of $\varphi_{top\_OLED\_TFE}$ changes according to change in the thickness of an external cavity layer, which plays an important role in determining peak positions. According to one embodiment of the present disclosure, the active cavity layer 330 may generate light according to a first resonance phenomenon in a self-emissive device, and the generated light may be transmitted to the external cavity layer 350 through the second reflector layer 340.

For example, the external cavity layer 350 may reflect a secondary resonance phenomenon to the transmitted light, and the secondary resonance phenomenon may be associated with the number of multiple resonance modes and the characteristics of an externally extracted light spectrum.

Accordingly, the present disclosure may simultaneously form three narrow peaks in RGB wavelength bands by a first resonance phenomenon according to the thickness of the same active cavity layer and a secondary resonance phenomenon corresponding to an external cavity effect.

That is, the first active cavity layer 331 may exhibit a broad peak and a narrow spectrum at a resonance wavelength of 600 nm to 700 nm, the second active cavity layer 332 may exhibit a broad peak and a narrow spectrum at a resonance wavelength of 500 nm to 600 nm, and the third active cavity layer 333 may exhibit a broad peak and a narrow spectrum at a resonance wavelength of 400 nm to 500 nm.

Figure 4A:
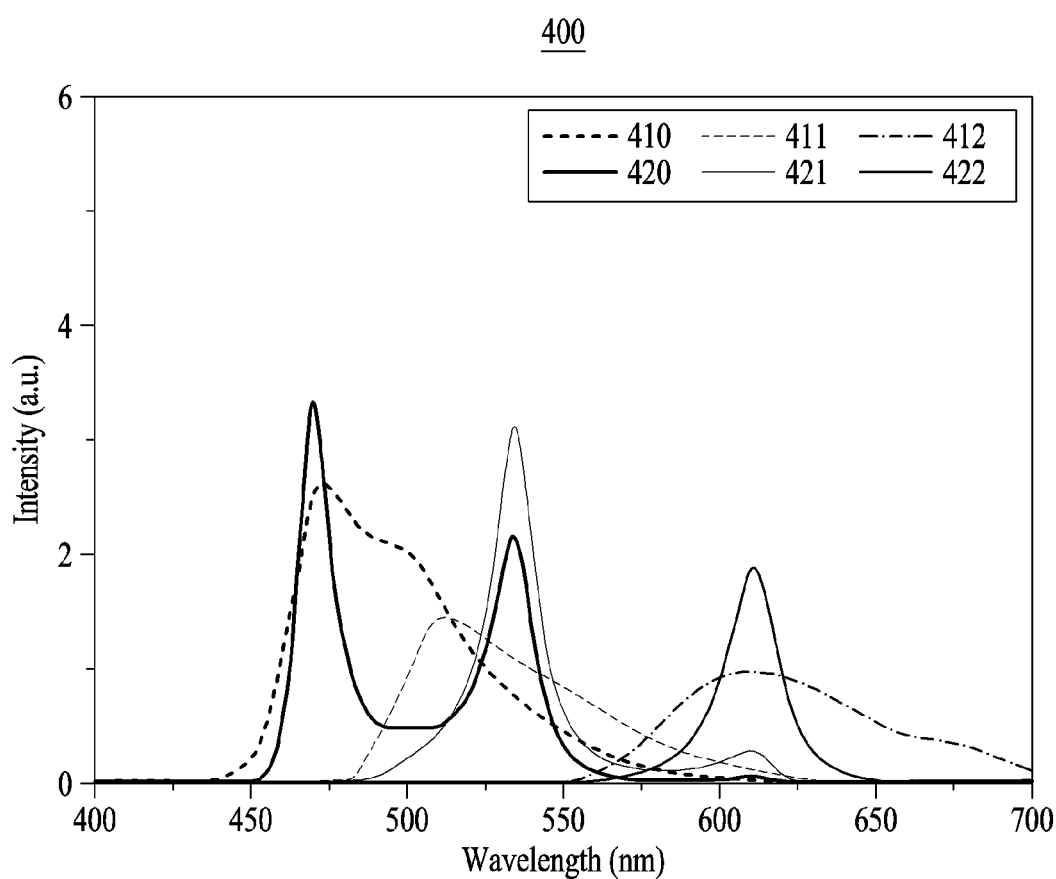
FIG. 4A is a graph showing the photoluminescence (PL) spectrum and electroluminescence (EL) spectrum of an optoelectronic device having a dual micro-cavity structure according to one embodiment of the present disclosure.

The peaks and narrow spectra associated with the first, second, and third active cavity layers 331, 332, and 333 may be shown in FIG. 4A.

For example, as the thickness of the external cavity layer increases, the number of multiple resonance modes may increase.

For example, the external cavity layer 350 may form a plurality of peaks around a specific resonance wavelength based on the increased number of multiple resonance modes. Here, the specific resonance wavelength may be expressed as a resonance wavelength determined in the external cavity layer.

In addition, all peaks may be seen at all resonance wavelengths generated by the resonance mode of the active cavity layer and the multiple resonance modes of the external cavity layer.

FIG. 3B illustrate an optoelectronic device having a dual micro-cavity structure according to another embodiment of the present disclosure.

Referring to FIG. 3B, the optoelectronic device 300 having a dual micro-cavity structure includes the substrate 310, the first reflector layer 320, the active cavity layer 330, the second reflector layer 340, the external cavity layer 350, a light absorption layer 351, the third reflector layer 360, and the passivation layer 370.

The active cavity layer 330 and the external cavity layer 350 of the optoelectronic device 300 described in FIG. 3B are different from those of the optoelectronic device 300 described in FIG. 3A.

That is, in the optoelectronic device 300 described in FIG. 3B, the active cavity layer 330 may be formed of the third active cavity layer 333 described in FIG. 3A, and the third active cavity layer 333 may correspond to a blue region.

In addition, the external cavity layer 350 may include the light absorption layer 351 for controlling some of multiple resonance modes generated in the external cavity layer 350.

For example, some resonance modes may be resonance modes corresponding to lower orders among multiple resonance modes and may be related to a green region.

For example, the light absorption layer 351 may include at least one light absorbing material of Cr, W, Ni, Ti, and Ge.

For example, since the external cavity layer 350 further includes the light absorption layer 351 including a light absorption material, such as Cr, W, Ni, and Ti, as a thin film to suppress an unwanted green wavelength peak in the blue light-emitting device, the light absorption layer 351 may control a resonance mode generated in the external cavity layer 350.

Accordingly, the present disclosure may provide an optoelectronic device based on a dual micro-cavity structure that may simultaneously realizes the high Q factors of three primary colors.

In addition, the present disclosure may save fabrication cost and time by forming active cavity layers in the same thickness without a micro-patterning operation by a dual micro-cavity structure.

FIG. 4A is a graph showing the photoluminescence (PL) spectrum and electroluminescence (EL) spectrum of an optoelectronic device having a dual micro-cavity structure according to one embodiment of the present disclosure.

Referring to FIG. 4A, a graph 400 shows the photoluminescence (PL) spectrum of an active cavity layer according to one embodiment of the present disclosure and the electroluminescence (EL) spectrum of an optoelectronic device having a dual micro-cavity structure according to one embodiment of the present disclosure.

In the graph 400, a first dotted line 410 may represent the PL of a blue layer, a second dotted line 411 may represent the PL of a green layer, and a third dotted line 412 may represent the PL of a red layer.

In addition, in the graph 400, a first solid line 420 may represent the EL of a blue layer, a second solid line 421 may represent the EL of a green layer, and a third solid line 422 may represent the EL of a red layer.

That is, the first dotted line 410 to the third dotted line 412 may represent the PL spectrum of each RGB, and the first solid line 420 to the third solid line 422 may represent the EL spectrum of light extracted to the outside of an optically designed micro-cavity in simulation for each RGB.

Spectra with peaks and narrow FWHM at each RGB resonance wavelength (470 nm, 534 nm, 610 nm) are observed. In the same thickness of RGB active cavity layers, the intensity of light is improved compared to RGB PL spectra. This indicates that RGB lights with a narrow FWHM may be extracted to the outside.

That is, the first active cavity layer constituting the active cavity layer may exhibit a peak and a narrow spectrum at a resonance wavelength of 610 nm, the second active cavity layer may exhibit a peak and a narrow spectrum at a resonance wavelength of 534 nm, and the third active cavity layer may exhibit a peak and a narrow spectrum at a resonance wavelength of 470 nm.

The above-described resonance wavelengths are examples and are not limited to the numerical values. The first active cavity layer may exhibit a broad peak and a narrow spectrum at a resonance wavelength of 600 nm to 700 nm, the second active cavity layer may exhibit a broad peak and a narrow spectrum at a resonance wavelength of 500 nm to 600 nm, and the third active cavity layer may exhibit a broad peak and a narrow spectrum at a resonance wavelength of 400 nm to 500 nm.

Although the first solid line 420 of the graph 400 has two peaks, this may be improved by using a color filter or a PL spectrum material having a peak at a wavelength of 450 nm.

Figure 4B:
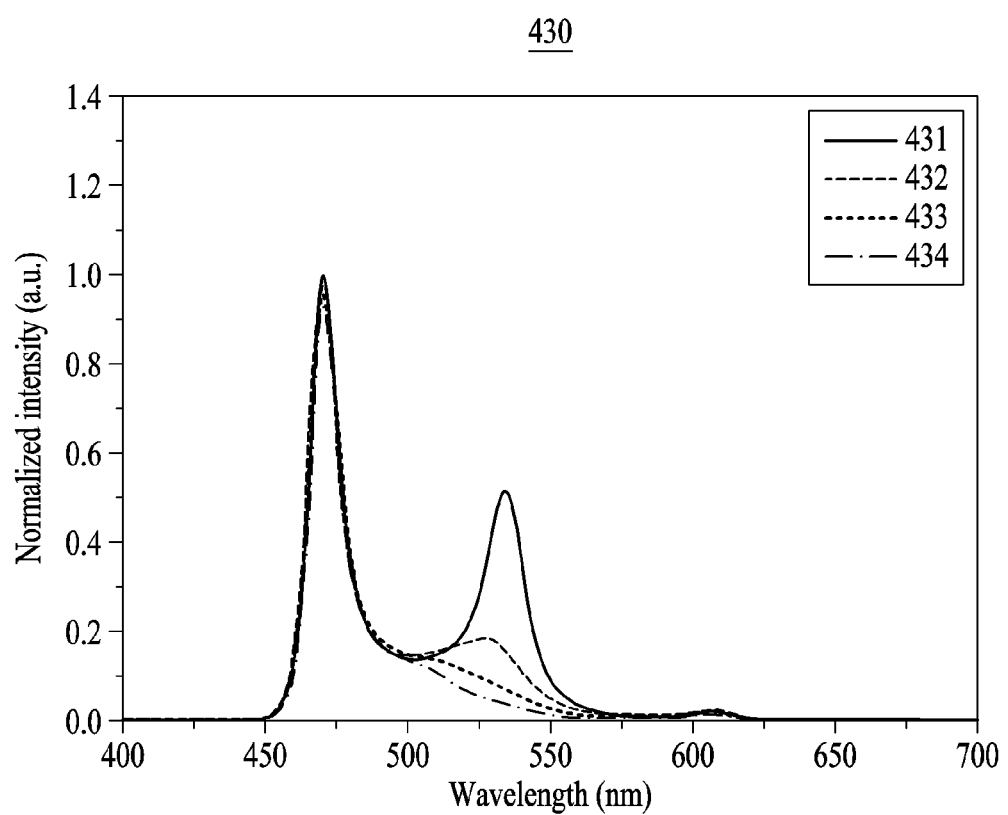
FIG. 4B is a graph showing the spectrum of an optoelectronic device having a dual micro-cavity structure including a light absorption layer in an external cavity layer according to one embodiment of the present disclosure.

FIG. 4B is a graph showing the spectrum of an optoelectronic device having a dual micro-cavity structure including a light absorption layer in an external cavity layer according to one embodiment of the present disclosure.

FIG. 4B is a graph showing change in the spectrum of an optoelectronic device having a dual micro-cavity structure according to change in the thickness of a light absorption layer included in an external cavity layer according to one embodiment of the present disclosure.

Referring to FIG. 4B, a graph 430 shows a first case 431 in which a light absorption layer is absent, a second case 432 in which the thickness of a light absorption layer is 2 nm, a third case 433 in which the thickness of a light absorption layer is 4 nm, and a fourth case 434 in which the thickness of a light absorption layer is 6 nm.

Comparing the first case 431 to the fourth case 434, it can be seen that the light intensity of a green region decreases as the thickness of a light absorption layer increases.

By including a light absorption layer in an external cavity layer, improvement may be realized by suppressing the low-order resonance mode of the external cavity layer.

In this case, the light absorption layer may include a light-absorbing material such as Cr, W, Ni, Ti, and Ge.

Since the optoelectronic device having a dual micro-cavity structure according to one embodiment of the present disclosure further includes the light absorption layer in the external cavity layer, a resonance mode generated in the external cavity layer may be suppressed. Accordingly, light intensity may be adjusted by suppressing the resonance mode of a green region corresponding to a lower order among multiple resonance modes and suppressing the peak of the green region.

Accordingly, a dual micro-cavity structure may be fabricated without a patterning operation such as E-beam lithography.

In addition, since active cavities has the same thickness, the same electrical characteristics may be obtained.

Accordingly, the present disclosure may provide an optoelectronic device based on a dual micro-cavity structure that may simultaneously realizes the high Q factors of three primary colors.

In addition, the present disclosure may obtain a high Q factor as the FWHM of a spectrum is narrowed due to the number of resonance modes of a dual micro-cavity, and thus the color purity of the three primary colors is improved.

In addition, the present disclosure may simultaneously improve the Q factors of the three primary colors before a color filter by emitting a white color in addition to RGB colors.

In addition, the present disclosure may provide an optoelectronic device that may be used in various fields such as a display, lighting, a color conversion device, and a medical device.

Figure 5:
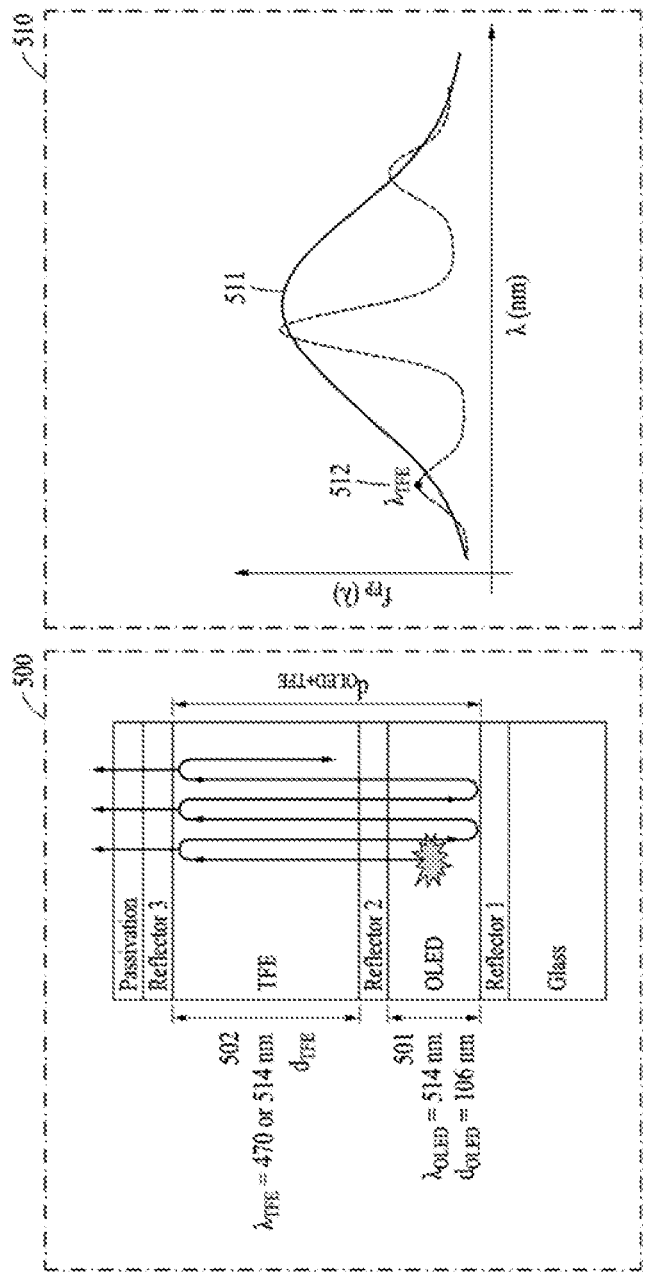
FIG. 5 includes drawings for explaining the cavity effect of an optoelectronic device having a dual micro-cavity structure according to one embodiment of the present disclosure.

FIG. 5 includes drawings for explaining the cavity effect of an optoelectronic device having a dual micro-cavity structure according to one embodiment of the present disclosure.

Referring to FIG. 5, a structure 500 and a graph 510 show the overall resonance phenomenon of a TOT (top-emitting OLED with a thin film encapsulation) structure.

The solid line graph may represent spectral characteristics generated by the effects of an active cavity and an external cavity.

The active cavity acts as an envelope and may affect the overall shape of a spectrum. As the cavity length of the external cavity increases, the overall cavity length of the OLED structure may increase.

Accordingly, in the TOT structure, the number of cavity modes may be increased to first-order, second-order, third-order, and the like, generating three sharp peaks in each RGB wavelength band. For example, the cavity mode may correspond to a resonance mode.

That is, in the structure 500, an active cavity envelope 511 of the graph 510 is determined according to change in the thickness of $d_{OLED}$ with respect to an active cavity layer 501.

In the structure 500, a specific resonance wavelength ($\lambda_{TFE}$) is determined according to change in the thickness of $d_{TFE}$ with respect to an external cavity layer 502, and several peaks converge around a specific resonance wavelength.

In addition, change in the thickness of $d_{OLED+TFE}$, which is a sum of the thickness of $d_{OLED}$ and the thickness of $d_{TFE}$, is determined by change in the thickness of $d_{TFE}$. Finally, in the graph 510, a Fabry-Perot factor may be expressed as change in a specific resonance wavelength 512.

Figure 6A:
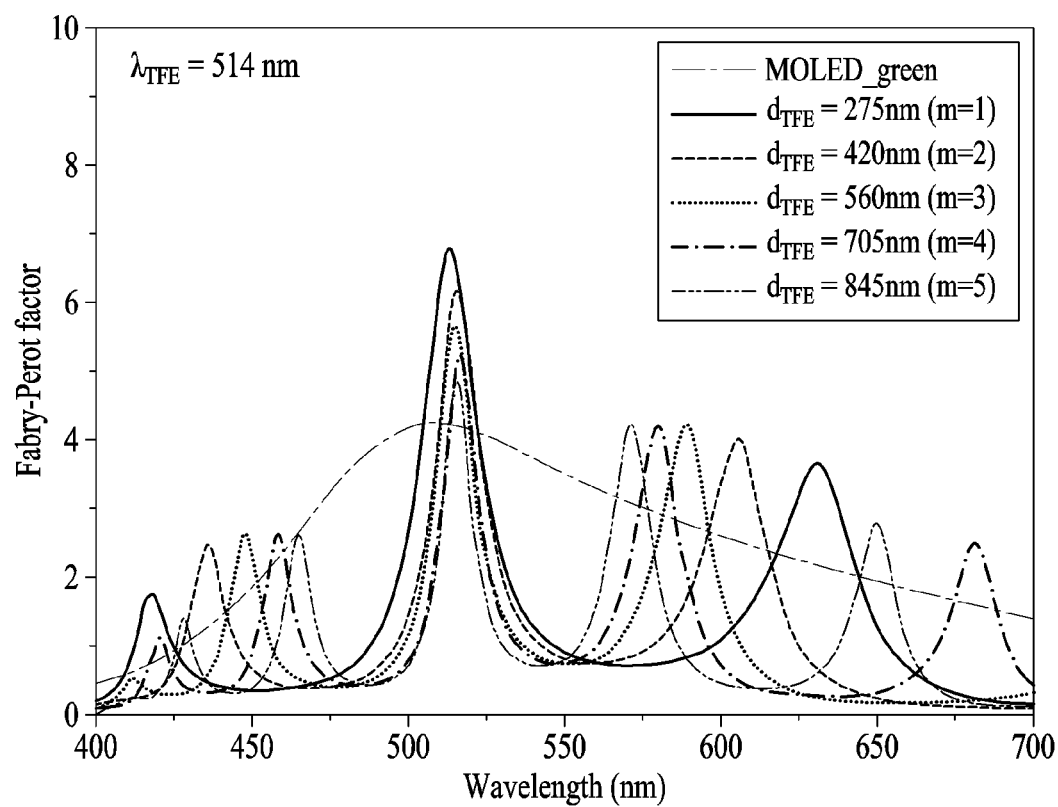
FIGS. 6A and 6B are graphs showing Fabry-Perot factors depending on change in the thickness of an external cavity layer in a dual micro-cavity structure according to one embodiment of the present disclosure.
Figure 6B:
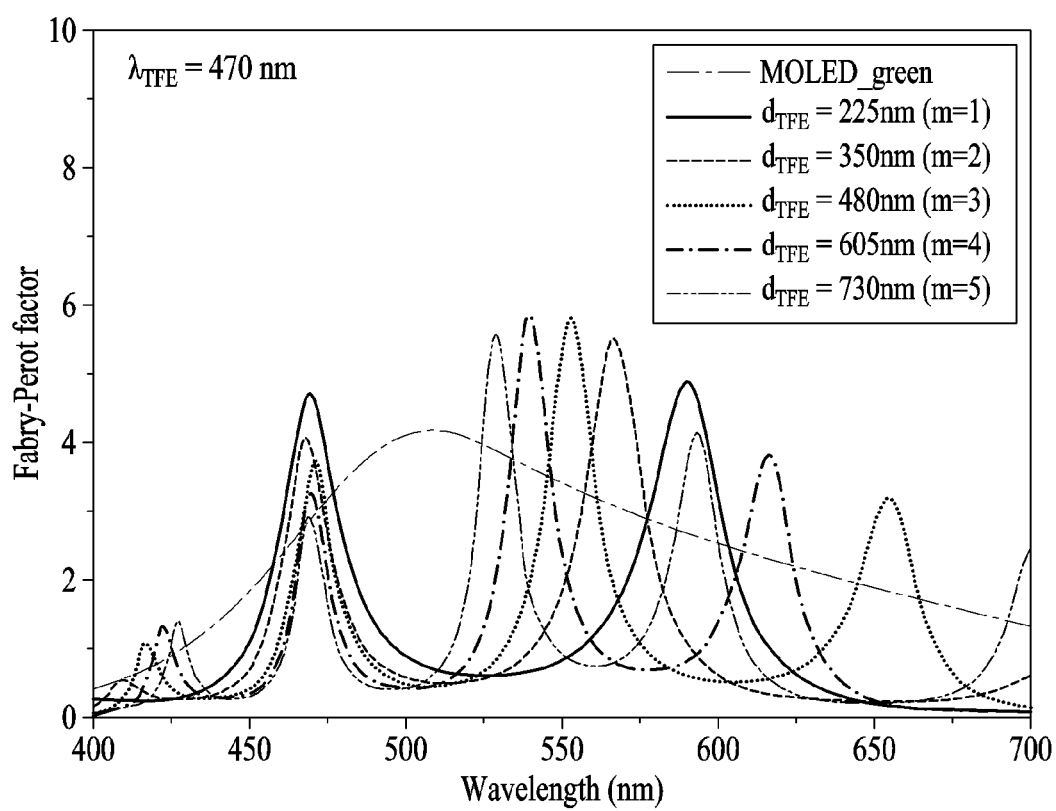

FIGS. 6A and 6B are graphs showing Fabry-Perot factors depending on change in the thickness of an external cavity layer in a dual micro-cavity structure according to one embodiment of the present disclosure.

More specifically, FIGS. 6A and 6B show the change of a Fabry-Perot factor calculated according to change in the thickness of an external cavity layer in a dual micro-cavity structure according to one embodiment of the present disclosure, FIG. 6A is a graph for explaining a dual micro-cavity structure designed with the same resonance wavelength of an active cavity layer and an external cavity layer, and FIG. 6B is a graph for explaining a dual micro-cavity structure designed with different resonance wavelengths of the active cavity layer and the external cavity layer.

FIG. 6A is based on the structure of the optoelectronic device having a dual micro-cavity structure according to one embodiment of the present disclosure. When the resonance wavelength of an OLED of an active cavity layer is designed to be 514 nm, the thickness of an OLED layer may be formed to be 106 nm, and the specific resonance wavelength of the TFE of an external cavity layer may be designed to be 514 nm.

That is, a graph 600 shows Fabry-Perot factors calculated based on the structure of an optoelectronic device having a dual micro-cavity structure when an active cavity layer and an external cavity layer are designed with the same resonance.

In the graph 600, when the thickness of a TFE layer is 275 nm, 420 nm, 560 nm, 705 nm, and 845 nm, the number of cavity modes of the TFE may be divided into second-order (m=1), third-order (m=2), fourth-order (m=3), fifth-order (m=4), and sixth-order (m=5).

For example, the total number of cavity modes of TOT is the number (m=1, 2, 3, 4, 5) of second-order, third-order, fourth-order, fifth-order, and sixth-order resonance modes of TFE added to the number (m=0) of first-order resonance modes of OLED. When the resonance mode of the TFE is second-order, it is third-order. In the case of third-order, it is fourth-order, and it may be classified as an order in which one is added to the number of TFE resonance modes.

According to one embodiment of the present disclosure, when the specific resonance wavelength of the external cavity layer is designed to be the same as the resonance wavelength of the active cavity layer, the intensity of light at the specific resonance wavelength may be remarkably increased. Here, the prominent increase may indicate that the intensity of light is convex in a specific portion on the graph.

In the graph 600, the specific resonance wavelength may be 514 nm.

The peak of the optoelectronic device having a dual micro-cavity structure follows the spectral shape of MOLED_green.

Several peaks occurred around a green wavelength band in the visible light region, but the intensity of light in a blue wavelength band was less than that in green and red wavelength bands, respectively.

FIG. 6B is a graph showing Fabry-Perot factors according to change in the thickness of the external cavity layer of an optoelectronic device having a dual micro-cavity structure according to one embodiment of the present disclosure.

FIG. 6B shows change in a calculated Fabry-Perot factor in which the constructive interference conditions of TFE satisfies a blue wavelength band (=470 nm) in relation to the optoelectronic device having a dual micro-cavity structure according to one embodiment of the present disclosure.

A graph 610 of FIG. 6B shows Fabry-Perot factors calculated according to the thickness of TFE.

FIG. 6B shows Fabry-Perot factors calculated based on the structure of an optoelectronic device having a dual micro-cavity structure when the resonance wavelength of an OLED of an active cavity layer is designed to be 514 nm, and the specific resonance wavelength of TFE of an external cavity layer is designed to be 470 nm.

That is, the graph 610 shows Fabry-Perot factors calculated based on the structure of an optoelectronic device having a dual micro-cavity structure when an active cavity layer and an external cavity layer are designed with different resonances.

For example, by adjusting the specific resonance wavelength of the external cavity layer, the intensity of light generated in a resonance wavelength may be controlled. In the graph 610, the resonance wavelength of the active cavity layer is 514 nm, and the specific resonance wavelength of the external cavity layer is 470 nm. That is, the active cavity layer and the external cavity layer are designed differently.

When the thickness of the TFE layer is 225, 350, 480, 605, and 730 nm, the number of cavity modes of the TFE may be second-order (m=1), third-order (m=2), fourth-order (m=3), fifth-order (m=4), and sixth-order (m=5).

In a blue wavelength band (=470 nm), the peak value increases to about 4.85, and several peaks converge around a specific resonance wavelength of 470 nm. That is, it can be seen that peaks in the blue wavelength region are improved.

Referring to the graph 600 and the graph 610, depending on the resonance mode of the external cavity layer, the intensity of light generated at the resonance wavelength of a light spectrum extracted to the outside may be different.

That is, the optoelectronic device according to one embodiment of the present disclosure may adjust the intensity of light generated at the resonance wavelength of a light spectrum extracted to the outside according to the resonance mode of the external cavity layer.

For example, in the optoelectronic device, a secondary resonance phenomenon is reflected. Thus, when a specific resonance wavelength determined in the external cavity layer is the same as the resonance wavelength of the active cavity layer, the intensity of light at the specific resonance wavelength is controlled to increase. By adjusting the resonance wavelength of the active cavity layer and the specific resonance wavelength of the external cavity layer, the light intensity of a resonance wavelength may be controlled.

Figure 7:
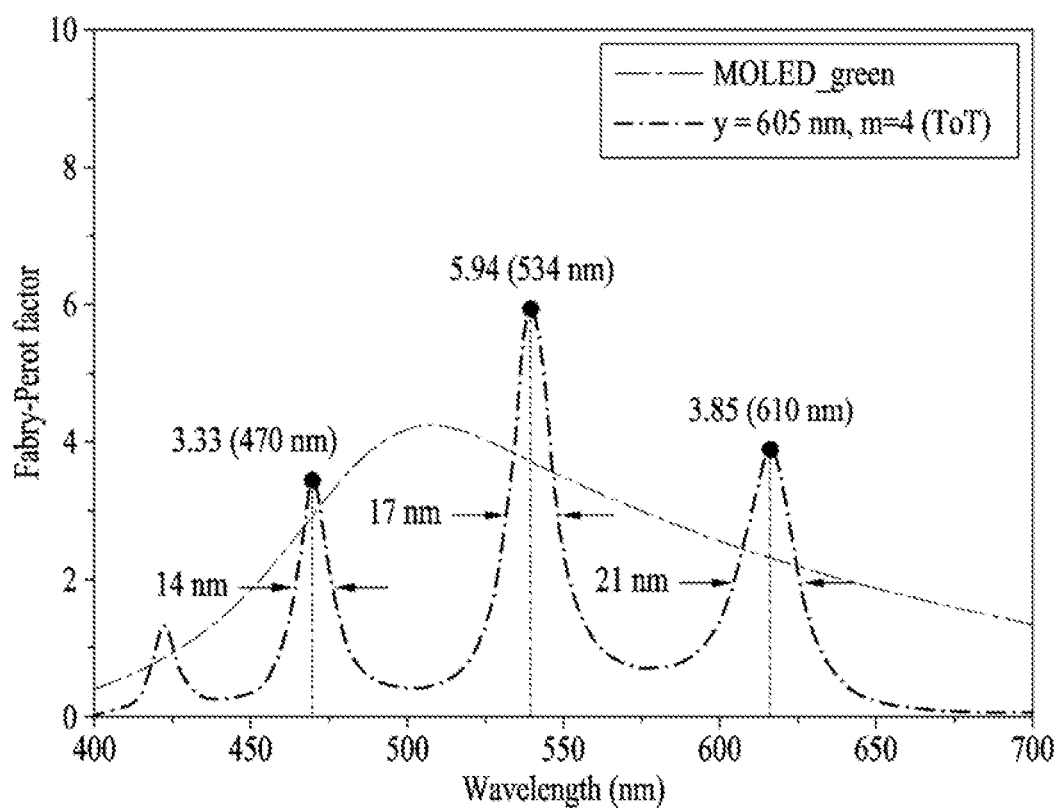
FIG. 7 is a graph showing the Fabry-Perot factors of an optoelectronic device having a dual micro-cavity structure designed at a specific external cavity thickness according to one embodiment of the present disclosure.

FIG. 7 is a graph showing the Fabry-Perot factors of an optoelectronic device having a dual micro-cavity structure designed at a specific external cavity thickness according to one embodiment of the present disclosure.

A graph 700 of FIG. 7 shows Fabry-Perot factors calculated when the thickness of a TFE layer is 605 nm (m=4).

A TOT structure exhibits three peaks in blue (470 nm), green (534 nm), and red (610 nm) wavelength bands, respectively. The intensity of light at each wavelength is about 3.33, 5.94, and 3.85, and FWHM is about 14 nm, 17 nm, and 21 nm, respectively.

Figure 8A:
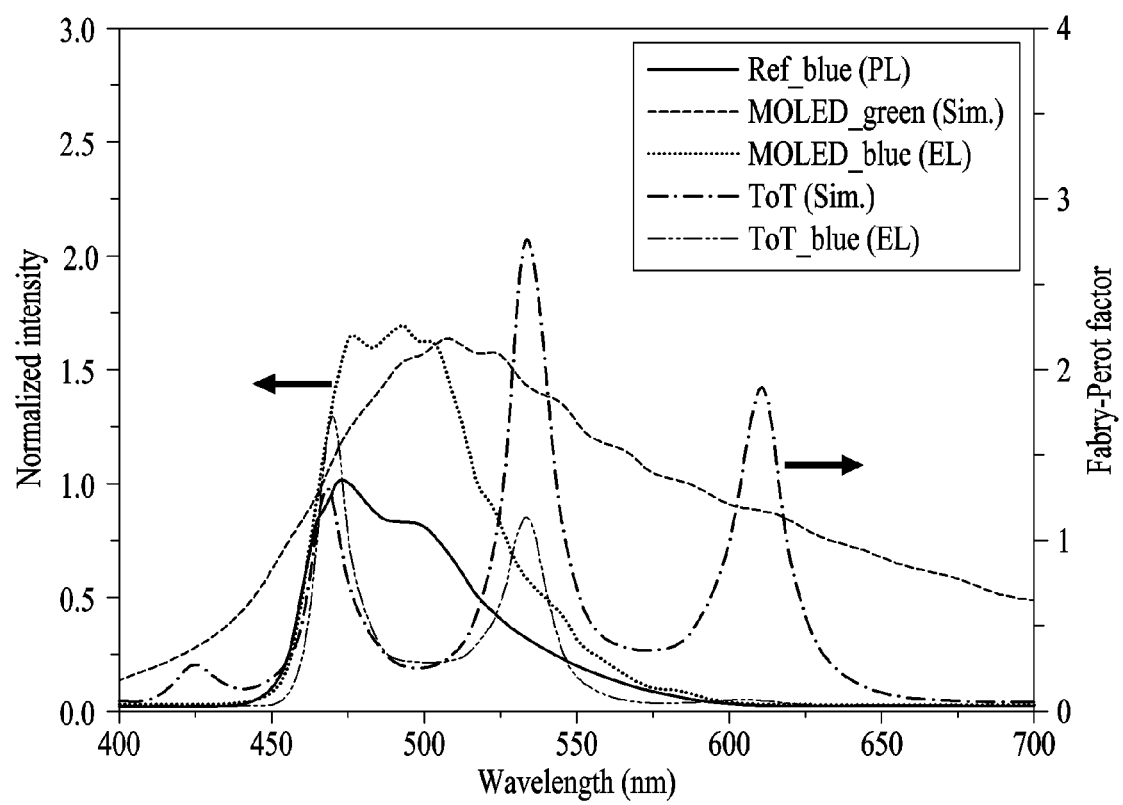
FIGS. 8A to 8C are graphs showing Fabry-Perot factors and spectrum changes in each of RGB wavelength bands associated with an optoelectronic device having a dual micro-cavity structure according to one embodiment of the present disclosure.
Figure 8B:
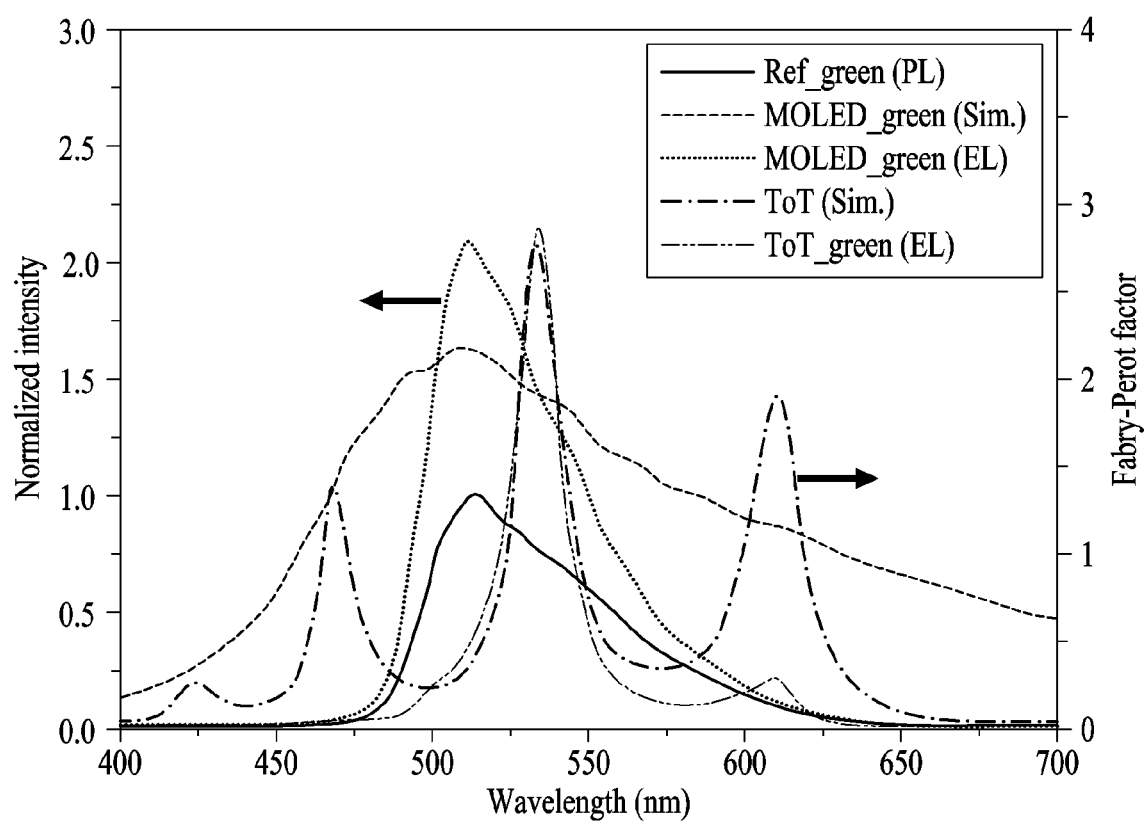
Figure 8C:
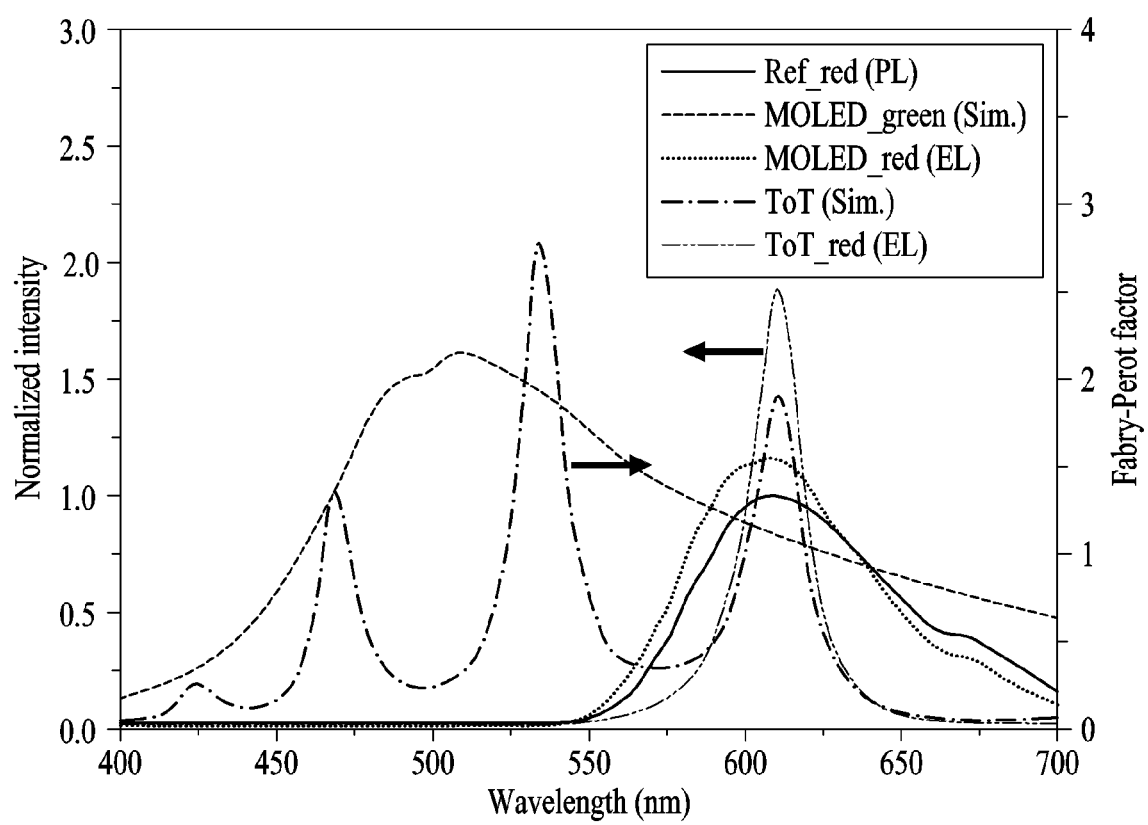

FIGS. 8A to 8C are graphs showing Fabry-Perot factors and spectrum changes in each of RGB wavelength bands associated with an optoelectronic device having a dual micro-cavity structure according to one embodiment of the present disclosure.

In a graph 800 of FIG. 8A, a graph 810 of FIG. 8B, and a graph 820 of FIG. 8C, dotted line graphs show the calculated Fabry-Perot factors of a micro-cavity-based optoelectronic device designed with the same active cavity layer according to the prior art and an optoelectronic device having a dual micro-cavity structure according to one embodiment of the present disclosure. In addition, gray solid line graphs may be the PL spectrum of each RGB light emitting material.

The solid line graphs of the micro-cavity-based optoelectronic device designed according to the prior art and the optoelectronic device having a dual micro-cavity structure according to one embodiment of the present disclosure show PL spectra and an electroluminescence (EL) spectra that are the product of Fabry-Perot factors of the micro-cavity-based optoelectronic device designed according to the prior art and the optoelectronic device having a dual micro-cavity structure according to one embodiment of the present disclosure.

Here, the micro-cavity-based optoelectronic device designed according to the prior art may correspond to MOLED_green, and the optoelectronic device having a dual micro-cavity structure according to one embodiment of the present disclosure may correspond to TOT.

That is, the graph 800 to the graph 820 show spectral change upon applying RGB PL to micro cavities designed under the following conditions.

For the above-mentioned conditions, in MOLED_green, an active cavity layer has a resonance wavelength of 514 nm, and spectral change by applying RGB PL by applying the same active cavity layer in the micro-cavity of the prior art is shown. TOT has a dual micro-cavity structure, and the resonance wavelength of an active cavity layer is 514 nm, and the specific resonance wavelength of an external cavity layer is 470 nm. By applying the same active cavity layer in a dual micro-cavity, spectral change by applying RGB PL may be shown.

The graph 800 of FIG. 8A shows the spectral change of an OLED using a blue light-emitting material.

In the EL spectrum, the intensity of TOT_blue is less than that of MOLED blue, but the width of a spectrum is narrowed.

The intensity is 1.3, FWHM is 13 nm, and a peak at a wavelength of 534 nm may occur due to a designed resonance wavelength peak of TOT_green.

A graph 810 of FIG. 8B shows the spectral change of an OLED using a green light-emitting material.

In the EL spectrum, the intensity of MOLED_green and the intensity of TOT_green are similar, and the FWHM of TOT_green is decreased to 16 nm compared to the FWHM of MOLED_green.

The graph 820 of FIG. 8C shows the spectral change of an OLED using a red light-emitting material.

The intensity of TOT_red is 1.9, which is more than that of MOLED red. FWHM is narrowed down to 20 nm.

From the graph 800 to the graph 820, it can be seen that the dual micro-cavity structure according to one embodiment of the present disclosure narrows the peak width of a RGB wavelength band. This spectral change may improve the purity of OLED RGB colors.

The present disclosure can provide an optoelectronic device based on a dual micro-cavity structure that can simultaneously realizes the high Q factors of three primary colors.

The present disclosure can simultaneously form three narrow peaks in RGB wavelength bands by a first resonance phenomenon according to the thickness of the same active cavity layer and a secondary resonance phenomenon corresponding to an external cavity effect.

The present disclosure can save fabrication cost and time by forming active cavity layers in the same thickness without a micro-patterning operation by a dual micro-cavity structure.

The present disclosure can control the characteristics of light spectra extracted to the outside by designing the resonance mode of an external cavity layer as multiple resonance modes without considering electrical properties as the same electrical properties are obtained due to the same thickness of active cavity layers.

The present disclosure can obtain a high Q factor as the FWHM of a spectrum is narrowed due to the number of resonance modes of a dual micro-cavity, and thus the color purity of the three primary colors is improved.

The present disclosure can simultaneously improve the Q factors of the three primary colors before a color filter by emitting a white color in addition to RGB colors.

The present disclosure can provide an optoelectronic device that may be used in various fields such as a display, lighting, a color conversion device, and a medical device.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

What is claimed is:

1. An optoelectronic device, wherein the optoelectronic device is applied to a self-emissive device, and the optoelectronic device comprises:
   a first reflector layer;
   a first self-emissive device in which an active cavity layer is formed on the first reflector layer;
   a second self-emissive device in which a second reflector layer is formed on the active cavity layer;
   a third self-emissive device in which an external cavity layer is formed on the second reflector layer;

a third reflector layer formed on the external cavity layer; and a passivation layer formed on the third reflector layer, wherein the optoelectronic device generates a first micro-cavity corresponding to the first and second reflector layers and a second micro-cavity corresponding to the second and third reflector layers, wherein the active cavity layer comprises a first active cavity layer, a second active cavity layer, and a third active cavity layer, and in consideration of optical and electrical characteristics of the active cavity layer, the first micro-cavity is designed for a first-order resonance mode, generating light based on a resonance phenomenon according to the first-order resonance mode within the first to the third self-emissive devices, wherein at least one of the first to the third self-emissive devices has a same thickness, reflecting a photoluminescence spectrum of a luminescent material, thereby adjusting a primary emission spectrum, which is then propagated to the second reflector layer, wherein the external cavity layer is designed for multiple resonance modes to form multiple peaks in a visible range, controlled by an effective optical distance due to a thickness variation of the external cavity layer, forming resonance modes in a wavelength range corresponding to luminescent peaks of at least one of the first to the third self-emissive devices based on the multiple resonance modes, simultaneously forming spectral peaks for a secondary resonance phenomenon, and wherein the secondary resonance phenomenon is reflected on the generated light propagated through the second reflector layer, adjusting the emission spectrum of the first to the third self-emissive devices in a secondary manner, designing the first-order resonance mode according to the thickness of the active cavity layer, thereby controlling the size of the peaks according to the secondary resonance phenomenon differently in at least one of the first to the third self-emissive devices.

2. The optoelectronic device according to claim 1, wherein the active cavity layer comprises an organic or inorganic emission material, and the external cavity layer comprises an organic or inorganic passivation material.

3. The optoelectronic device according to claim 1, wherein the first reflector layer comprises at least one of metallic electrode materials comprising at least one of gold, silver, and aluminum, alloy materials of gold, silver, and aluminum, and metamaterials, and the second and third reflector layers comprise semi-transparent electrode materials comprising silver.

4. The optoelectronic device according to claim 3, wherein the first reflector layer has a thickness of 100 nm or more, the second reflector layer has a thickness of 1 nm to 30 nm, and the third reflector layer has a thickness of 1 nm to 30 nm.

5. The optoelectronic device according to claim 1, wherein, when the secondary resonance phenomenon is reflected and a specific resonance wavelength determined in the external cavity layer is identical to a resonance wavelength of the active cavity layer, an intensity of light at the specific resonance wavelength is controlled to increase, and a light intensity of a resonance wavelength is controlled by adjusting a resonance wavelength of the active cavity layer and the specific resonance wavelength.

6. The optoelectronic device according to claim 1, wherein, as a thickness of the external cavity layer increases, the number of multiple resonance modes increases.

7. The optoelectronic device according to claim 6, wherein the external cavity layer forms a plurality of peaks around a specific resonance wavelength based on the increased number of multiple resonance modes.

8. The optoelectronic device according to claim 7, wherein the external cavity layer comprises a light absorption layer for controlling some of the increased multiple resonance modes generated in the external cavity layer.

9. The optoelectronic device according to claim 8, wherein the light absorption layer comprises at least one light absorbing material of Cr, W, Ni, Ti, and Ge.

10. The optoelectronic device according to claim 1, wherein the first active cavity layer exhibits a broad peak and a narrow spectrum at a resonance wavelength of 600 nm to 700 nm, the second active cavity layer exhibits a broad peak and a narrow spectrum at a resonance wavelength of 500 nm to 600 nm, and the third active cavity layer exhibits a broad peak and a narrow spectrum at a resonance wavelength of 400 nm to 500 nm.

* * * * *